United States Patent [19]

Sukonnik et al.

[11] Patent Number: 5,055,967
[45] Date of Patent: Oct. 8, 1991

[54] SUBSTRATE FOR AN ELECTRICAL CIRCUIT SYSTEM AND A CIRCUIT SYSTEM USING THAT SUBSTRATE

[75] Inventors: Israil M. Sukonnik, Plainville, Mass.; James A. Forster, Barrington, R.I.; Henry F. Breit, Attleboro; Gary A. Raphanella, South Easton, both of Mass.

[73] Assignee: Texas Instruments Incorporated, Dallas, Tex.

[21] Appl. No.: 551,695

[22] Filed: Jul. 11, 1990

Related U.S. Application Data

[63] Continuation of Ser. No. 262,863, Oct. 26, 1988, abandoned.

[51] Int. Cl.[5] .............................................. H05K 7/20
[52] U.S. Cl. .................................... 361/387; 174/258; 361/403; 428/901
[58] Field of Search .......................... 428/901, 472.2; 361/403, 402, 386, 405, 387, 397, 414, 417, 418, 419; 357/81, 80; 165/185; 174/252, 256, 258, 259, 260

[56] References Cited

U.S. PATENT DOCUMENTS

| | | | |
|---|---|---|---|
| 3,537,907 | 11/1970 | Wilson | 136/132 |
| 3,702,427 | 11/1972 | Learn | 357/80 |
| 4,495,378 | 1/1985 | Potzer | 361/387 |
| 4,574,879 | 3/1986 | DeGrea | 165/185 |
| 4,835,061 | 3/1989 | Ohta | 428/469 |
| 4,943,468 | 6/1990 | Gordon | 428/210 |

OTHER PUBLICATIONS

"Hard-Annodizing of Aluminum by Low Voltage", M. Lerner & M. Morse, Sanford Process Corp., Natick Mass, 1980, pp. 1-9.
"Aluminum Alloy", Materials Handbook, 11th Edition, 1977, McGraw-Hill, pp. 37.

Primary Examiner—Gerald P. Tolin
Attorney, Agent, or Firm—James P. McAndrews; John A. Haug; Melvin Sharp

[57] ABSTRACT

A substrate is provided for mounting semiconductor devices and comprises an electrically conductive circuit layer, a base layer of an aluminum metal material, and an electrically insulating hard coating dielectric layer of amorphous aluminum oxide which is directly adherent to the base layer for mounting the electrically conductive circuit layer thereon.

34 Claims, 2 Drawing Sheets

SUBSTRATE FOR AN ELECTRICAL CIRCUIT SYSTEM AND A CIRCUIT SYSTEM USING THAT SUBSTRATE

This application is a continuation of application Ser. No. 07/262,863, filed Oct. 26, 1988, now abandoned.

BACKGROUND OF THE INVENTION

The field of the invention is that of electrical circuit systems and the invention relates more particularly to novel and improved substrates for use in mounting semiconductor devices and other circuit components in the electrical circuit systems.

Currently used or proposed insulated metal substrates for electronic circuits and the like embody a rigid, thermally conducting, metal base layer, a dielectric layer of polymer or ceramic or the like on the base layer, and a conductive copper film on the dielectric layer to be etched for forcing a desired circuit path pattern. Such substrates mount semiconductor devices and other circuit components in electrically and thermally connected relation to the circuit paths for forming circuit systems, and heat generated during operation of such systems is withdrawn from the semiconductor devices and other components and dissipated through the base layer of the substrates. In such substrates, a polymer dielectric layer is sometimes relied upon for bonding the electrically conductive circuit layer of the substrate to the base layer, and in other known substrates a film of dielectric material or the like is coated on both sides with an adhesive for bonding to the electrically conductive circuit layer and to the base layer. In such substrates the thickness of the dielectric layer is selected to provide the necessary degree of electrical insulation between the electrically conductive circuit layer and the heat-dissipating metal base layer to meet the requirements of specific electrical circuit systems. However it is frequently found that the thickness of the dielectric layer needed for this purpose tends to interfere to an undesirable like to the heat-dissipating base layer so that the semiconductor devices cannot be operated in their optimum temperature condition. As a result, some of the recently proposed substrates which incorporate polymer dielectric layers have the polymers filled with alpha alumina or other thermally conducting but electrically non-conducting materials for improving heat-transfer through the dielectric layer. Such dielectric layers tend to be difficult to form in very thin layers and, when provided in thin layers, are sometimes found to have non-uniform dispersal of the alumina therein so they provide non-uniform heat-withdrawal from various parts of an electrical circuit system. It has also been proposed from time to time that the surfaces of an aluminum heat sink member be anodized for forming an electrically insulating coating thereon but such systems also tend to require dielectric layers of substantial thickness for meeting electrical insulation requirements. More recently, electrical insulation and heat-withdrawal requirements for electrical circuit systems have tended to become progressively more stringent and it is found that known insulated metal substrates frequently do not provide suitably economical means for mounting semiconductor devices and the like while also providing both the electrical insulation and heat-dissipating properties required for such systems. It would be very desirable to provide a circuit system having an economical insulated metal substrate incorporating a dielectric layer of improved electrically insulating and thermally conducting properties.

SUMMARY OF THE INVENTION

It is an object of this invention to provide a novel and improved substrate for mounting a semiconductor device or the like; to provide such a substrate including an electrically conductive circuit layer, a metal base layer, and an electrically insulating dielectric layer for mounting the conductive circuit layer on the metal base layer in selected electrically insulated relation to the base layer and in improved heat-transfer relation to the base layer; to provide such a substrate which is economical and reliable; and to provide a novel and improved electrical circuit system using such a substrate.

Briefly described the novel and improved substrate of this invention for mounting semiconductor devices and the like comprises an electrically conductive circuit layer, a base layer of an aluminum metal material, and an electrically insulating hard coating dielectric layer of amorphous aluminum oxide which is directly adherent to the base layer for mounting the electrically conductive circuit layer thereon. The electrically insulative hard coating layer of aluminum oxide is cyclically formed in a combined alternating-direct current process in situ on the aluminum metal base layer of the substrate using a conventional hard coating process for aluminum metal such as is commonly used for providing aluminum surfaces with mar and wear resistance or corrosion resistance and the like, that type of aluminum oxide hard coating being found to provide not only improved dielectric strength per unit thickness but also to provide improved thermal conductivity as compared with aluminum oxide coatings formed in the atmosphere or in conventional direct current anodizing processes and the like. Accordingly the dielectric layer of the substrate is adapted to have a very small thickness and significantly improved thermal conductivity for providing the necessary dielectric strength while also displaying markedly improved thermal transfer properties. In a preferred embodiment of the invention, the metal material of the substrate base layer comprises an aluminum metal alloy such as one of the 1000, 5000 or 6000 Series of Aluminum Alloys as designated by the Aluminum Association Incorporated, which alloys display good strength but are substantially free of iron and copper constituents and the like for assuring that the hard coating of aluminum oxide formed on that base metal as noted above is substantially free of iron and copper inclusions and the like such as might reduce the effective dielectric strength of the hard coating. In that way a very thin dielectric layer is achieved for providing improved heat-transfer from the substrate circuit layer to its base layer.

In preferred embodiments of the invention, the substrate includes adhesive materials for securing the electrically conductive circuit layer of the substrate to the electrically insulating hard coating layer of aluminum oxide with greater ease and reliability and such adhesive material cooperates with the hard coating layer of aluminum oxide in providing the desired degree of electrical insulation between the conductive circuit layer and the metal base layer of the substrate. In one embodiment, that adhesive material comprises an electrically insulating polymer film or the like and in another embodiment a dielectric film is coated on each of its two broad sides to be bonded to the circuit layer and the hard coating layer to supplement the electrical insulation properties of the hard coating.

In one preferred embodiment of the substrate, the electrically insulating hard coating layer of aluminum oxide comprises a multiplicity of sections of said hard coating layer which are adherent to the base layer but which are spaced apart from other sections of the hard coating layer. An electrically insulating polymer adhesive material or the like is disposed on and between the hard coating layer sections to cooperate with the sections of the hard coating layer of aluminum oxide for mounting the electrically conductive circuit layer of the substrate in the desired electrically insulated relation to the base metal layer. In that arrangement, the sections of the hard coating layer of the aluminum oxide extend into the polymer adhesive material to cooperate with the electrically insulating adhesive to provide a very thin dielectric layer having the desired electrical insulation for the conductive circuit path layer relative to the base layer while also providing very uniform and efficient heat-transfer from all parts of the conductive circuit path layer to the base layer.

DESCRIPTION OF THE DRAWINGS

Other objects, advantages and details of the novel and improved substrate and circuit system of this invention appear in the following detailed description of preferred embodiments of the invention, the detailed description referring to the drawings in which:

FIG. 2 is a partial section view to enlarged scale along line 2—2 of FIG. 1 illustrating a preferred embodiment of the novel and improved substrate provided by this invention for mounting semiconductor devices and the like;

DESCRIPTION OF THE PREFERRED EMBODIMENTS

Figure 1:
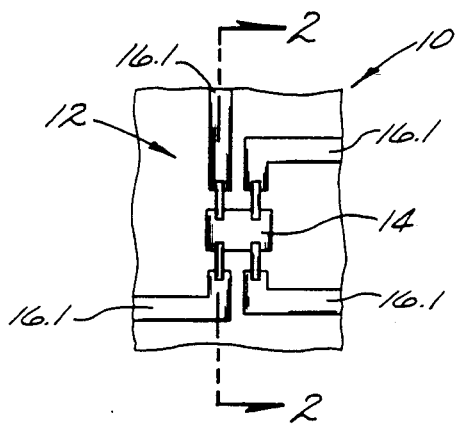
FIG. 1 is a partial plan view of a preferred embodiment of the novel and improved electrical circuit system of this invention.
Figure 2:
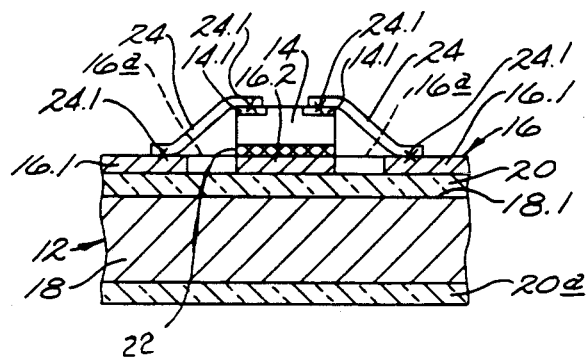

Referring to the drawings, 10 in FIGS. 1-2 indicates the novel and improved electrical circuit system of the invention which is shown to include the novel and improved substrate 12 of the invention and one or more semiconductor devices or other circuit components 14 mounted on the substrate. The substrate includes an electrically conductive circuit layer 16 of copper, aluminum or other electrically conductive material, a base layer 18 of an aluminum metal material, and, in accordance with this invention, an electrically insulating hard coating dielectric layer 20 of aluminum oxide which is directly adherent to the base metal layer. Typically, the electrically conductive circuit layer 16 is initially provided on the dielectric layer 20 in sheet or foil form and is then etched away in any conventional manner as indicated by the broken lines 16a in FIG. 2 to form circuit paths 16.1 and semiconductor mounting paths 16.2 and the like on the substrate. The semiconductor devices 14, etc. are then mounted on the pads or the like, as with thermally and electrically conducting solder or adhesive 22, or with an electrically insulating epoxy material or the like if preferred, in conventional manner. Terminals of the devices or components as diagrammatically indicated at 14.1 in FIG. 2 are electrically connected to the circuit paths 16.1 by use of bond wires 24 bonded to the terminals and paths as at 24.1. In that arrangement, the electrically conductive circuit layer 16 is formed on the hard coating dielectric layer 20 of aluminum oxide in any conventional way such as by evaporation, sputtering or plating or the like to be directly adherent to the hard coating of aluminum oxide as shown in FIG. 2 or is adhesively secured to the base layer by adhesive material in the dielectric layer as described below. It will be understood that the circuit coating layer 16 is deposited in foil form and then etched away as described above or is formed on the dielectric layer 20 in a desired pattern as may be preferred within the scope of this invention.

Figure 3:
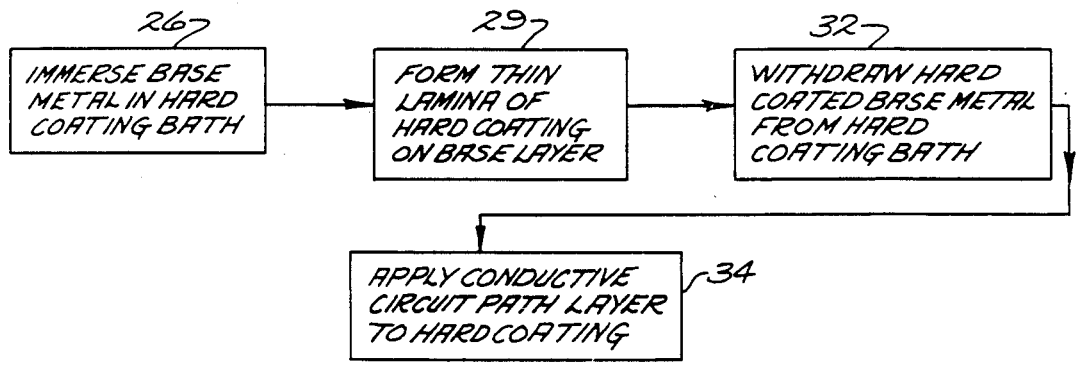
FIG. 3 is a block diagram diagrammatically illustrating formation of the electrically insulating hard coating layer of aluminum oxide in the substrate of FIG. 2.

In accordance with this invention, the electrically insulating hard coating layer 20 of aluminum oxide ($Al_2O_3$) as that term is used herein, is one which is provided on the base layer 18 of aluminum metal in any conventional amorphous aluminum oxide hard coating process such as is commonly used for providing aluminum metals with mar resistance, wear resistance or corrosion resistance and the like. As such hard coating processes are well known and are described in "Hard Anodizing of Aluminum By Low Voltage," by M. M. Lerner and J. H. Morse, 67th Annual Technical Conference, The American Society of Platers and Surface Finishers, Inc., Milwaukee, Wis., 1980, the process is not further described herein and it will be understood that in such hard coating process the base metal layer 18 is initially immersed in a hard coating electrolysis bath of sulfuric acid or the like as diagrammatically indicted at 26 in FIG. 3 to permit accelerated formation of amorphous aluminum oxide in situ at the surface 18.1 of the base metal layer in an alternating current-direct current process wherein thin lamina of the aluminum oxide hard coating are believed to be formed as indicated at 29 to build up the hard coating 20 with high density and wi high dielectric strength on the order of at least about 1000 volts/mil. The hard coated aluminum base metal layer is then removed from the bath as indicated at 32 and the electrically conductive circuit layer 16 is applied to the hard coating layer as indicated at 34. It is found that such hard coatings of aluminum oxide not only display high dielectric strength but also display improved thermal conductivity. Such hard coatings of aluminum oxide are distinguished from aluminum oxide coatings formed on aluminum metals in the normal atmosphere or in conventional direct current anodizing processes and the like which typically have dielectric strengths on the order of not more than about two hundred volts/mil.

Preferably the hard coating 20 of aluminum oxide is formed to be free of inclusions of iron or copper or other materials which might tend to reduce the dielectric strength of the hard coating and for that purpose the aluminum metal material of the base metal layer 18 is preferably selected to be substantially free of iron or copper constituents or the like which might result in introducing iron or copper inclusions or the like into the hard coating during the cyclic formation of the coating as described above. Preferably the base metal layer is also selected to provide high strength. Preferably for example, the aluminum metal material of the base layer is selected from the group of aluminum alloys consisting of 1000, 5000 or 6000 Series Aluminum Alloys as designated by the Aluminum Association Incorporated. Alternately the base layer comprises a composite metal laminate having an outer aluminum surface layer. For example, the composite can comprise at least one layer of metal of a relatively low coefficient of expansion such as Invar and can have layers of aluminum metal or alloy metallurgically bonded either directly or by use of intermediate layers to the low expansion metal by roll bonding or the like. Alternately the aluminum layer is deposited in the composite by sputtering or evaporation or the like.

In that arrangement, the electrically insulating hard coating dielectric layer 20 of aluminum oxide in the substrate 12 is adapted to be provided with a very small thickness on the order of 1 to 2 mils for meeting the electrical insulating requirements of many electrical circuit systems in the range from 6000 to 10000 volts. Accordingly the substrate 12 and the system 10 incorporating that substrate are made with improved economy and adapted to display improved operating characteristics by permitting the semiconductor devices and other components 14 and the like to operate at more desirable temperature levels.

Figure 4:
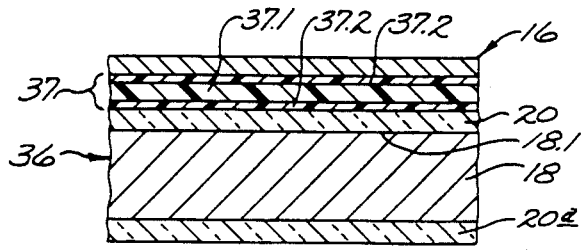
FIG. 4 is a partial section view similar to FIG. 2 illustrating an alternate preferred embodiment of the substrate of this invention.

In an alternate embodiment 36 of the substrate of this invention as illustrated in FIG. 4, in which corresponding reference numerals are used, the dielectric layer 20 is supplemented by use of an additional layer 37 adhesively secured to both the hard coating layer 20 and the electrically conductive circuit layer 16 for more easily and reliably securing or bonding the conductive circuit layer to the hard coating layer 20. In one preferred embodiment as shown, the additional layer comprises a thin sheet or foil 37.1 of an electrically insulating organic polymer material such as the polyimide sold under the designation Kapton having a layer 37.2 of a conventional electrically insulating acrylic adhesive material such as that sold commercially by E. I. DuPont DeNemours under the designation DuPont Pyrolux on each side of the polymer layer, the additional layer with its polymer and adhesive layers cooperating with the hard coating layer 20 for providing the substrate with the desired degree of electrical insulation between the conductive circuit layer 16 and the metal base layer 18. That is adhered at one side to a copper foil forming the conductive circuit layer 16 and at its other side to the hard coating 20 formed on the base metal 18 as will be understood. If desired, where the polymer material of the layer 37.1 has desired adhesive properties, as in the case of a polymer material comprising an alpha alumina-filled acrylic epoxy adhesive, the adhesive coatings 37.2 can be omitted and the polymer material itself can be relied upon to bond the conductive circuit layer 16 to the base metal layer. In that latter arrangement, the polymer material can be laminated on the hard coating layer 20 to receive a copper foil 16 thereon and the polymer can be cured by heating or the like forming the film 37.1 in situ between the circuit layer 16 and the hard coating layer 20. It is noted that the use of the hard coating of aluminum oxide provides improved adhesion for the polymer, on the order of about 25% improvement in peel strength. Such a substrate is economically made with improved properties. For example, where such an alpha alumina-filled acrylic epoxy adhesive layer was provided on a hard coating dielectric layer formed in situ on an aluminum base layer of 6061 Aluminum Alloy having a thickness of 0.062 inches, the thermal resistance of the combination was found to be about 0.44 watts/° C. Materials tested on identical fashion were found to display thermal resistances as follows:

| Aluminum metal (0.062 inch) | 0.041 watts/°C. |
| Copper metal (0.040 inch) | 0.021 watts/°C. |
| Conventional Glass Epoxy (0.062 inch) (G10 e.g.) | 4.210 watts/°C. |

Figure 5:
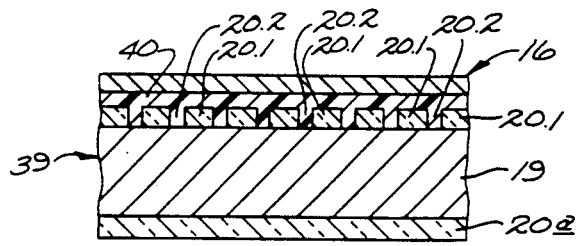
FIG. 5 is a section view to enlarged scale similar to FIG. 2 illustrating another alternate preferred embodiment of the substrate of this invention.
Figure 6:
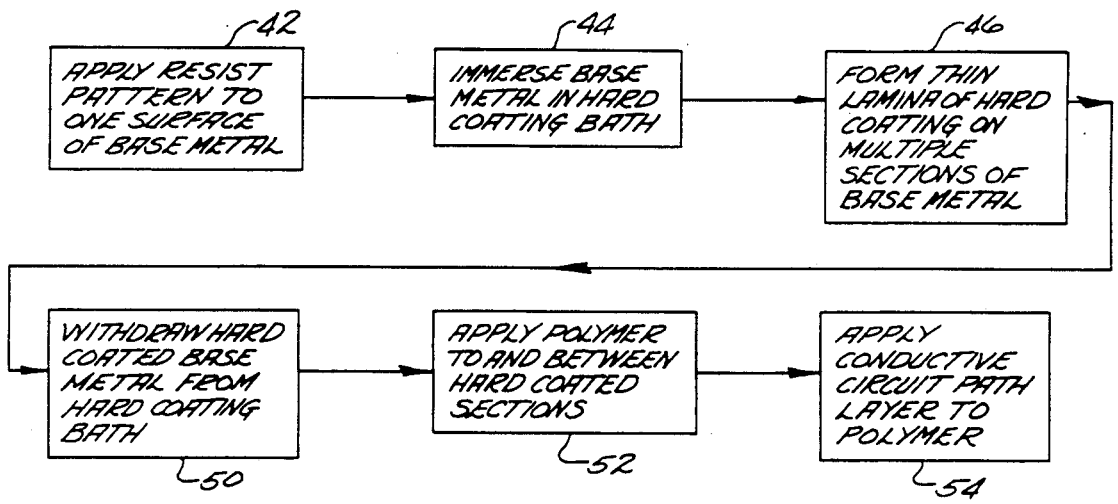
FIG. 6 is a block diagram diagrammatically illustrating formation of the electrically insulating hard coating layer of aluminum oxide of the substrate of FIG. 4.

In another alternate embodiment 38 of the substrate of the invention as illustrated in FIG. 5, the hard coating layer 20 of the substrate comprises a multiplicity of sections 20.1 of the hard coating of aluminum oxide and those sections are spaced apart from other sections of the hard coating layer, the sections of the hard coating layer being adherent to the surface 18.1 of the base metal layer. An electrically insulating adhesive material 40 such as the alpha alumina-filled acrylic epoxy polymer material described above is deposited on the sections 20.1 and in the spaces 20.2 between the sections for bonding the electrically conductive circuit layer 16 to the base metal layer 18. That is, the adhesive 40 fills the spaces between the spaced sections of the hard coating to bond directly to the base metal layer itself and also bond to the noted sections of the hard coating. In that arrangement, the thickness of the electrically insulating adhesive material is selected to secure the conductive circuit layers 16 in the desired electrically insulated relation to the base metal 18 and the individual sections 20.1 of the hard coating of aluminum oxide cooperate with the adhesive in providing that electrical insulation layer while also serving to enhance thermal conductivity from the conductive circuit layer to the base metal layer, the hard coating material having relatively much greater thermal conductivity than such an adhesive polymer or the like. Typically for example, such individual sections 20.1 of the hard coating of aluminum oxide are formed by applying a resist grid pattern to a clean substantially oxide-free surface of the base metal layer 18 for defining grid sections of square or other configuration or the like having a width of about 0.02 to 100 mils separated by resist spacer of about 0.01 to 10 mils width as is diagrammatically indicated at 42 in FIG. 6. The resist patterned base metal layer is then immersed in the hard coating bath as indicated at 44; thin lamina of the hard coating are then formed in adhered relation to the base metal at the multiple square grid sections as diagrammatically indicated at 46; the base metal coated with the sections 20.1 formed thereon is removed from the hard coating bath as indicated at 50; and the resist is removed. The polymer adhesive material 40 is then deposited on and between the sections 20 as indicated at 52 and the conductive circuit layer 16 of copper or the like is adhesively bonded to the adhesive material 40 for forming the substrate 38 as is diagrammatically illustrated at 54 in FIG. 6. In that arrangement, the substrate 38 is adapted to be provided with a very thin dielectric layer having very high and uniform thermal conductivity properties. Alternately, the resist pattern is selected to provide a hard coating layer having a multiplicity of small perforations therein so that sections of the hard coating are spaced by the perforations therebetween. The adhesive material is then applied to cover the hard coating and to fill the perforations in the hard coating as will be understood.

It should be understood that although various embodiments of the invention have been described by way of illustrating the invention, this invention includes all modifications and equivalents of the disclosed embodiments falling within the scope of the appended claims.

We claim:

1. A substrate for mounting electrical components including semiconductor devices comprising an electrically conductive circuit layer, a base layer comprising an aluminum material, and an electrically insulating hard coating dielectric layer of amorphous aluminum oxide having a dielectric strength on the order of at least 1000 volts/mil directly adherent to the aluminum material of the base layer mounting the electrically conductive circuit layer thereon in selected electrically insulated relation to the base layer in heat-transfer relation to the base layer.

2. A substance according to claim 1 wherein the base layer comprises an aluminum metal alloy substantially free of iron and copper constituents, and the electrically insulating hard coating layer of amorphous aluminum oxide is substantially free of iron and copper inclusions therein for mounting the electrically conductive circuit layer in said selected electrically insulated relation to the base layer in said heat-transfer relation to the base layer.

3. A substrate according to claim 2 wherein the base layer material is selected from the group of aluminum metal alloys consisting of the 1000, 5000 and 6000 Series of Aluminum Alloys.

4. A substrate according to claim 1 having an additional layer adhesively securing the electrically conductive circuit layer to the electrically insulating hard coating layer of amorphous aluminum oxide for cooperating with the electrically insulating hard coating layer of amorphous aluminum oxide in mounting the electrically conductive circuit layer in said selected electrically insulated relation to the base layer.

5. A substrate according to claim 4 wherein the additional layer comprises a layer of an electrically insulating organic polymer material having a selected thickness for cooperating with the electrically insulating hard coating layer of amorphous aluminum oxide in mounting the electrically conductive circuit layer in said electrically insulated relation to the base layer.

6. A substrate according to claim 5 wherein the organic polymer material has adhesive properties for securing the electrically conductive circuit layer to the electrically insulating hard coating layer of amorphous aluminum oxide.

7. A substrate according to claim 4 wherein the additional layer comprises a supplemental layer of an electrically insulating material of selected thickness having adhesive material thereon, the supplemental layer and said adhesive material having a selected thickness for mounting the electrically conductive circuit layer in said electrically insulated relation to the base layer.

8. A substrate according to claim 7 wherein the supplemental layer comprises an electrically insulating organic polymer.

9. A substrate according to claim 8 wherein the organic polymer material has inclusions of electrically insulating inorganic material improving the thermal conductivity of the supplemental layer.

10. A substrate according to claim 7 wherein the supplemental layer comprises an electrically insulating inorganic material.

11. A substrate according to claim 1 wherein the electrically insulating hard coating layer of amorphous aluminum oxide comprises a multiplicity of sections of said hard coating of amorphous aluminum oxide with spacings therebetween, the sections being adherent to the base layer, and an electrically insulating adhesive material is disposed on and between said sections of amorphous aluminum oxide to cooperate with the sections of the hard coating layer of amorphous aluminum oxide for mounting the electrically conductive circuit layer in said selected electrically insulated relation to the base layer with said heat-transfer relation to the base layer.

12. A substrate according to claim 11 wherein the base layer comprises an aluminum metal alloy substantially free of iron and copper constituents, and the electrically insulating hard coating layer of amorphous aluminum oxide is substantially free of iron and copper inclusions therein for mounting the electrically conductive circuit layer in said selected electrically insulated relation to the base in said heat-transfer relation to the base layer.

13. A substrate according to claim 1 wherein the base metal layer comprises a composite metal material having at least one layer of metal of relatively low coefficient of thermal expansion metallurgically bonded to outer layers of an aluminum metal material for providing the base metal layer with a selected, effective coefficient of thermal expansion relatively lower than that of the aluminum metal material itself.

14. A substrate for mounting electrical components including semiconductor devices comprising an electrically conductive circuit layer, a base layer of aluminum metal material, an electrically insulating layer comprising a multiplicity of sections of a coating of aluminum oxide adherent to the base layer and having spacings between sections, and an electrically insulating adhesive material disposed on and between said sections of the coating of aluminum oxide adhered to said sections and to the base layer between said sections for cooperating with said sections of said coating layer of aluminum oxide and mounting the electrically conductive circuit layer thereon in selected electrically insulated relation to the base layer in heat-transfer relation to the base layer.

15. An electrical circuit system comprising an electrical component and an insulated metal substrate, the insulated metal substrate comprising an electrically conductive circuit layer electrically and thermally connected to the component, a base layer of an aluminum material, and an electrically insulating hard coating dielectric layer of amorphous aluminum oxide having a dielectric strength on the order of at least 1000 volts/mil directly adherent to the aluminum material of the base layer mounting the electrically conductive circuit layer thereon in selected electrically insulated relation to the base layer and in heat-transfer relation to the base layer.

16. An electrical circuit system according to claim 15 wherein the base layer comprises an aluminum metal alloy substantially free of iron and copper constituents and the electrically insulating hard coating layer of amorphous aluminum oxide is substantially free of iron and copper inclusions therein.

17. An electrical circuit system according to claim 16 wherein the electrically insulating hard coating layer of amorphous oxide comprises a multiplicity of sections of said hard coating of amorphous aluminum oxide with spaces therebetween adherent to the base layer, and an electrically insulating adhesive material is disposed on and between said sections of the hard coating of amorphous oxide to cooperate with the sections for mounting the electrically conductive circuit layer in said selected electrically insulated relation to the base layer with said heat-transfer relation to the base layer.

18. A substrate for mounting electrical components including semiconductor devices comprises an electrically conductive circuit layer, a base layer comprising an aluminum material, and an electrically insulating hard coating dielectric layer of amorphous aluminum oxide formed in situ on the aluminum base layer in an amorphous aluminum oxide hard coating process to be of high density having dielectric strength on the order of at least 1000 volts/mil to be directly adherent to the aluminum material of the base layer mounting the electrically conductive circuit layer thereon in selected electrically insulated relation to the base layer in heat-transfer relation to the base layer.

19. A substrate according to claim 18 wherein the base layer comprises an aluminum metal alloy substantially free of iron and copper constituents, and the electrically insulating hard coating layer of amorphous aluminum oxide is substantially free of iron and copper inclusions therein for mounting the electrically conductive circuit layer in said selected electrically insulated relation to the base layer in said heat-transfer relation to the base layer.

20. A substrate according to claim 19 wherein the base layer material is selected from the group of aluminum metal alloys consisting of 1000, 5000 and 6000 Series of Aluminum Alloys.

21. A substrate according to claim 18 having an additional layer adhesively securing the electrically conductive circuit layer to the electrically insulating hard coating layer of amorphous aluminum oxide for cooperating with the electrically insulating hard coating layer of amorphous aluminum oxide in mounting the electrically conductive circuit layer in said selected electrically insulated relation to the base layer.

22. A substrate according to claim 21 wherein the additional layer comprises a layer of an electrically insulating organic polymer material having a selected thickness for cooperating with the electrically insulating hard coating layer of amorphous aluminum oxide in mounting the electrically conductive circuit layer in said electrically insulated relation to the base layer.

23. A substrate according to claim 22 wherein the organic polymer material has adhesive properties for securing the electrically conductive circuit layer to the electrically insulating hard coating layer of amorphous aluminum oxide.

24. A substrate according to claim 21 wherein the additional layer comprises a supplemental layer of an electrically insulating material of selected thickness having adhesive material thereon, the supplemental layer and said adhesive material having a selected thickness for mounting the electrically conductive circuit layer in said electrically insulated relation to the base layer.

25. A substrate according to claim 24 wherein the supplemental layer comprises an electrically insulating organic polymer.

26. A substrate according to claim 25 wherein the organic polymer material has inclusions of electrically insulating inorganic material improving the thermal conductivity of the supplemental layer.

27. A substrate according to claim 24 wherein the supplemental layer comprises an electrically insulating inorganic material.

28. A substrate according to claim 18 wherein the electrically insulating hard coating layer of amorphous aluminum oxide comprises a multiplicity of sections of said hard coating of amorphous aluminum oxide with spacings therebetween, the sections being adherent to the base layer, and a electrically insulating adhesive material is disposed on and between said sections of amorphous aluminum oxide to cooperate with the sections of the hard coating layer of amorphous oxide for mounting the electrically conductive circuit layer in said selected electrically insulated relation to the base layer with said heat-transfer relation to the base layer.

29. A substrate according to claim 28 wherein the base layer comprises an aluminum metal alloy substantially free of iron and copper constituents, and the electrically insulating hard coating layer of amorphous aluminum oxide is substantially free of iron and copper inclusions therein for mounting the electrically conductive circuit layer in said selected electrically insulated relation to the base layer in said heat-transfer relation to the base layer.

30. A substrate according to claim 18 wherein the base metal layer comprises a composite metal material having at least one layer of metal of relatively low coefficient of thermal expansion metallurgically bonded to outer layers of an aluminum metal material for providing the base metal layer with a selected, effective coefficient of thermal expansion relatively lower than that of the aluminum metal material itself.

31. A substrate for mounting electrical components including semiconductor devices comprising an electrically conductive circuit layer, a base layer of aluminum metal material, an electrically insulating layer comprising a multiplicity of sections of said hard coating of amorphous aluminum coating oxide formed in situ on the aluminum base layer in an amorphous aluminum oxide hard coating process to be of high density having a dielectric strength on the order of at least 1000 volts/mil. to be adherent to the base layer and having spacings between said sections, and an electrically insulating adhesive material disposed on and between said sections of hard coating of aluminum oxide adhered to said sections and to the base layer between said sections for cooperating with said sections of said hard coating layer of aluminum oxide for mounting the electrically conductive circuit layer thereon in selected electrically insulated relation to the base layer in heat-transfer relation to the base layer.

32. An electrical circuit system comprising an electrical component and an insulated metal substrate, the insulated metal substrate comprising an electrically conductive circuit layer electrically and thermally connected to the component, a base layer of an aluminum material, and an electrically insulated hard coating dielectric layer of amorphous aluminum oxide formed in situ on the aluminum base layer in an amorphous aluminum oxide hard coating process to be of high density having a dielectric strength on the order of at least 1000 volts/mil to be directly adherent to the aluminum material of the base layer mounting the electrically conductive circuit layer thereon in selected electrically insulated relation to the base layer and in heat-transfer relation to the base layer.

33. An electrical circuit system according to claim 32 wherein the base layer comprises an aluminum metal alloy substantially free of iron and copper constituents and the electrically insulating hard coating layer of amorphous aluminum oxide is substantially free of iron and copper inclusions therein.

34. An electrical circuit system according to claim 33 wherein the electrically insulating hard coating layer of amorphous aluminum oxide comprises a multiplicity of sections of said hard coating of amorphous aluminum oxide with spaces therebetween adherent to the base layer, and an electrically insulating adhesive material is disposed on and between said sections of the hard coating of amorphous aluminum oxide to cooperate with the sections for mounting the electrically conductive circuit layer in said selected electrically insulated relation to the base layer with said heat-transfer relation to the base layer.

* * * * *